(12) United States Patent
Kim

(10) Patent No.: US 7,887,979 B2
(45) Date of Patent: Feb. 15, 2011

(54) METHOD FOR FABRICATING RIM TYPE PHOTOMASK

(75) Inventor: Young Dae Kim, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 290 days.

(21) Appl. No.: 12/132,694

(22) Filed: Jun. 4, 2008

(65) Prior Publication Data

US 2009/0111034 A1 Apr. 30, 2009

(30) Foreign Application Priority Data

Oct. 31, 2007 (KR) .................. 10-2007-0110488

(51) Int. Cl.
*G03F 1/00* (2006.01)
(52) U.S. Cl. ....................................... 430/5
(58) Field of Classification Search ............ 430/5
See application file for complete search history.

(56) References Cited

U.S. PATENT DOCUMENTS

| 6,660,653 | B1 * | 12/2003 | Tzu et al. ............. 438/735 |
| 7,291,425 | B2 * | 11/2007 | Dulman .................. 430/5 |
| 2005/0069788 | A1 | 3/2005 | Tanaka et al. |
| 2007/0054200 | A1 | 3/2007 | Jung et al. |

FOREIGN PATENT DOCUMENTS

| JP | 2000-221660 | 8/2000 |
| KR | 10-1995-0021059 | 7/1995 |
| KR | 10-1999-0029567 | 4/1999 |
| KR | 10-2002-0051109 | 6/2002 |
| KR | 10-2008-0095153 | 10/2008 |

* cited by examiner

*Primary Examiner*—Mark F Huff
*Assistant Examiner*—Jonathan Jelsma
(74) *Attorney, Agent, or Firm*—Marshall, Gerstein & Borun LLP

(57) ABSTRACT

Provided is a method for fabricating a rim type photomask. The method includes forming a light blocking pattern and a phase shift pattern on a substrate, forming a groove in the substrate by etching an exposed portion of the substrate using the light blocking pattern and the phase shift pattern as an etch mask, forming a mask layer filling the groove formed in the substrate, forming a mask pattern selectively exposing the groove formed in the substrate by patterning the mask layer, reducing a critical dimension (CD) of the mask pattern by irradiating ultraviolet (UV) rays onto the substrate, etching the light blocking pattern using the mask pattern having the reduced CD as an etch mask; forming a height difference by etching the phase shift pattern by a predetermined thickness from a top surface of the phase shift pattern that is exposed by the etching of the light blocking pattern; and forming a photomask including a rim region defined by the phase shift pattern having the height difference by removing the mask pattern.

6 Claims, 7 Drawing Sheets

US 7,887,979 B2

METHOD FOR FABRICATING RIM TYPE PHOTOMASK

CROSS-REFERENCE TO RELATED APPLICATIONS

This patent claims priority to Korean patent application number 10-2007-0110488, filed on Oct. 31, 2007, which is incorporated by reference in its entirety.

TECHNICAL FIELD

This patent relates to a semiconductor device, and more particularly, to a method for fabricating a rim type photomask that can easily form a fine pattern.

BACKGROUND

In a fabricating process of a semiconductor device, a plurality of photolithography processes is performed to form patterns on a semiconductor substrate. Particularly, as the integration degree of semiconductor devices increases and a design rule of the patterns formed on the semiconductor substrate decreases, a critical dimension (CD) of the patterns also decreases. For this reason, a photomask with a fine pattern is required to form a highly integrated circuit through the photolithography processes. A binary mask has been generally used as a photomask. In the binary mask, a light blocking pattern is formed on a transparent substrate to irradiate transmitted light on a wafer only through the substrate. Recently, a phase shift mask that can form a finer pattern than the binary mask using a phase shift material having transmittance of several percent is mainly used as the photomask.

FIG. 1 illustrates a cross-sectional view of a rim type photomask as an example of a phase shift mask. Referring to FIG. 1, in a conventional rim type photomask, a mask pattern including a phase shift pattern 105 and a light blocking pattern 110 is disposed on a substrate 100. A groove having a predetermined depth is formed in the substrate 100 to define a phase shift region. The light blocking pattern 110 selectively blocks a portion of the phase shift pattern 105. In the phase shift pattern 105, a region blocked by the light blocking pattern 110 has a height relatively greater than that of the rest region of the phase shift pattern 105. That is, there is formed a height difference between the region blocked by the light blocking pattern 110 and the rest region, thereby defining a rim region 112. The rim region defined by the height difference becomes a high transmittance region which has a light transmittance higher than that of the region which is relatively high in height, that is, the region blocked by the light blocking pattern 110 when the pattern is transferred onto the substrate.

At least two or more lithography processes are required for fabricating such rim type photomask. An exposure process is performed using an electronic beam (e-beam) or a laser having a wavelength ranging from approximately 248 nm to approximately 365 nm in a process of forming the light blocking pattern 100. However, in the case of this exposure unit, it is disadvantageous because the overlay accuracy between the phase shift pattern 105 and the light blocking pattern 110 is approximately 50 nm or more. Therefore, if the overlay accuracy between the patterns 105 and 110 is poor, it is difficult to form a pattern having a size of less than approximately 100 nm. Therefore, since the CD of the pattern decreases, it is further difficult to form the rim type photomask.

SUMMARY OF THE INVENTION

In one embodiment, a method for fabricating a rim type photomask includes: forming a light blocking pattern and a phase shift pattern on a substrate; forming a groove in the substrate by etching an exposed portion of the substrate using the light blocking pattern and the phase shift pattern as an etch mask; forming a mask layer filling the groove formed in the substrate; forming a mask pattern selectively exposing the groove formed in the substrate by patterning the mask layer; reducing a critical dimension (CD) of the mask pattern by irradiating ultraviolet (UV) rays onto the substrate; etching the light blocking pattern using the mask pattern having the reduced CD as an etch mask; forming a height difference by etching the phase shift pattern by a predetermined thickness from a top surface of the phase shift pattern that is exposed by the etching of the light blocking pattern; and forming a photomask including a rim region defined by the phase shift pattern having the height difference by removing the mask pattern.

The substrate may include a quartz substrate, the phase shift pattern may include a molybdenum-based compound, and the light blocking pattern may include a chrome (Cr) layer.

The mask layer may include a positive type photoresist layer.

The forming of the mask pattern may be performed using a backside exposure process in which light is irradiated from a back side toward a front side of the substrate.

In the height difference formed in the phase shift pattern, a region which is relatively low in height may have transmittance ranging from approximately 5% to approximately 20%.

DETAILED DESCRIPTION

Hereinafter, a method for fabricating a semiconductor device in accordance with embodiments of the present invention will be described in detail with reference to the accompanying drawings.

Figure 1:
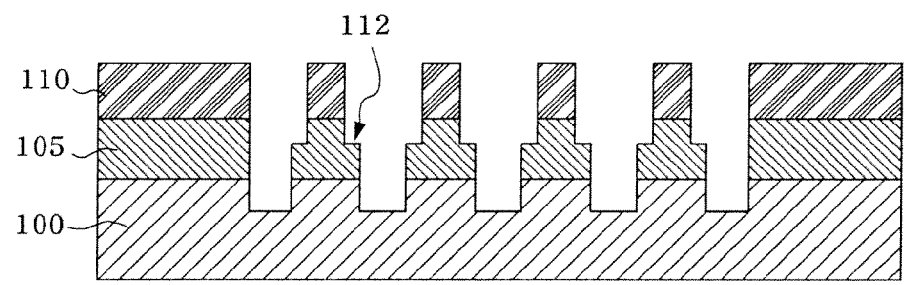
FIG. 1 illustrates a cross-sectional view of a rim type photomask as an example of a phase shift mask in accordance with the prior art.
Figure 2:
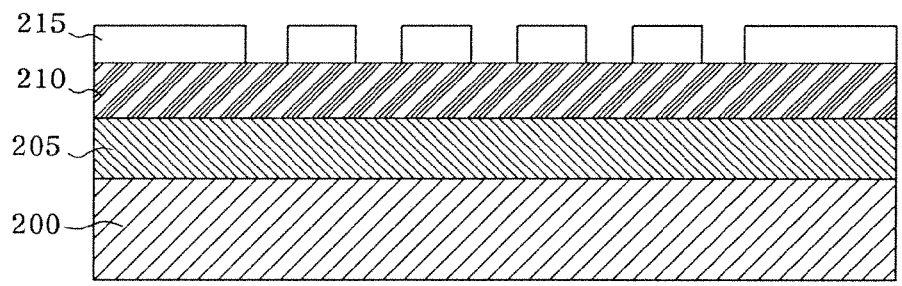
FIGS. 2 to 10 illustrate cross-sectional views of a process of fabricating a rim type photomask according to embodiments of the present invention.

Referring to FIG. 2, a phase shift layer 205 and a light blocking layer 210 are sequentially formed on a substrate 200. The substrate 200 includes a quartz substrate and is formed of a transparent material through which light can pass. The phase shift layer 205 formed on the substrate 200 is formed of a material that shifts a phase of light irradiated onto the substrate 200 during the following exposure process. The phase shift layer 205 may be formed of a compound including molybdenum (Mo), e.g., molybdenum silicon oxide nitride (MoSiON). The light blocking layer 210 formed on the phase shift layer 205 is formed of a material which blocks light passing through the substrate 200 during the following exposure process. The light blocking layer 210 may be formed of chrome (Cr). A first mask patterns 215 is formed on the light blocking layer 210. Lines of the first mask pattern 215 are spaced form each other by a predetermined distance to selectively expose portions of a surface of the light blocking layer 210. The first mask pattern 215 serves as a resist layer.

Figure 3:
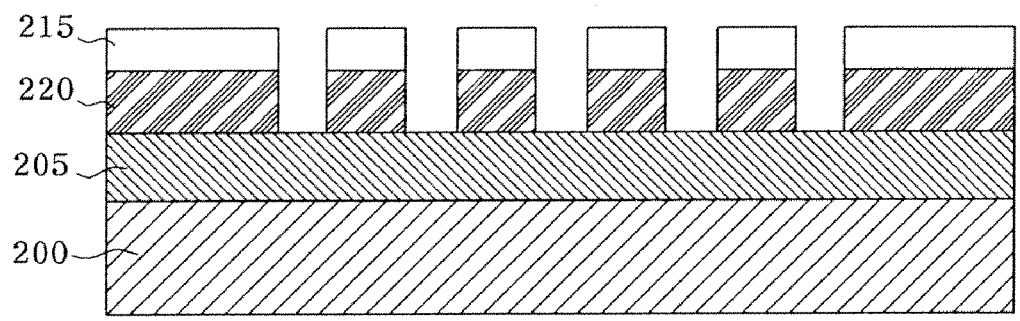

Referring to FIG. 3, a light blocking pattern 220 is formed by etching the exposed portions of the light blocking layer 210 using the first mask pattern 215 as a mask. Portions of a surface of the phase shift layer 205 are exposed by the light blocking pattern 220.

Figure 4:
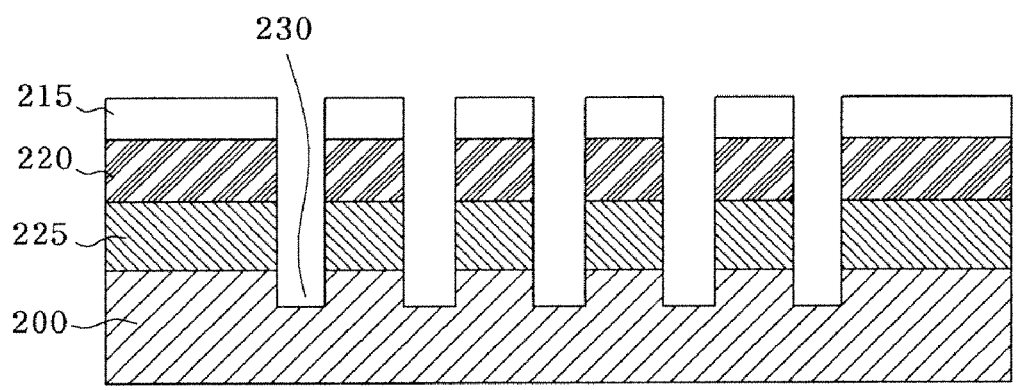

Referring to FIG. 4, a phase shift pattern 225 is formed by etching the phase shift layer 205 using the first mask pattern 215 and the light blocking pattern 220 as an etch mask. Portions of a surface of the substrate 200 are exposed by the phase shift pattern 225. Grooves 230 having a predetermined depth are formed in the substrate 200 by etching the exposed portions of the substrate 200 using the first mask pattern 215 or the phase shift pattern 225 as an etch mask. The first mask pattern 215 is removed, and a cleaning process is performed to remove photoresist scum generated during the forming of the pattern.

Figure 5:
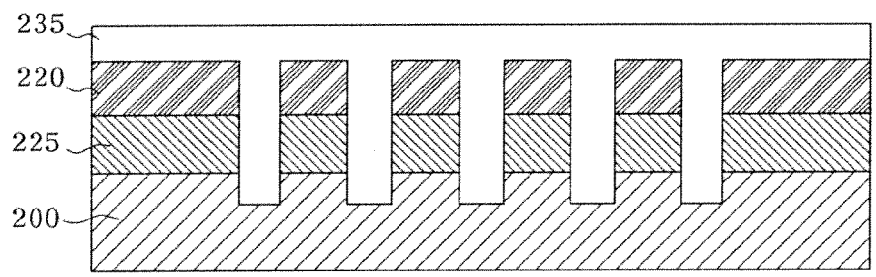

Referring to FIG. 5, a second mask layer 235 is formed over the substrate 200. The second mask layer 235 is formed such that it has a thickness enough to be adapted for covering the light blocking pattern 220 and the phase shift pattern 225 and filling the grooves 230. The second mask layer 235 is formed of a positive type photoresist material in which a portion irradiated by light during the exposure process is removed during a developing process.

Figure 6:
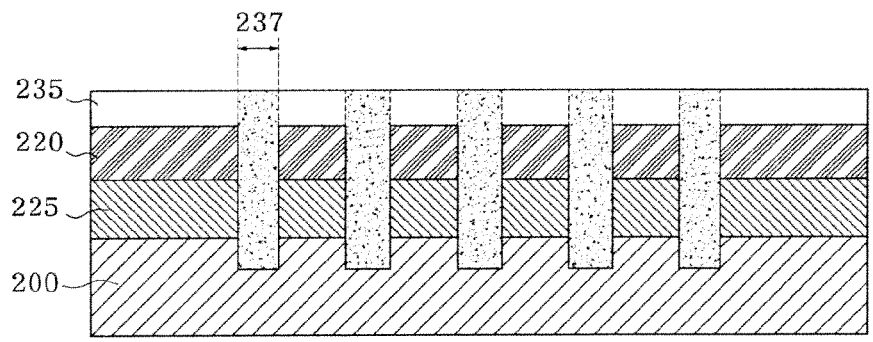

Referring to FIG. 6, a backside exposure process in which light is irradiated from a bottom surface of the substrate toward the second mask layer 235 is performed. When the backside exposure process is performed, a portion of light irradiated onto the substrate 200 is blocked by the light blocking pattern 220, and the other portion of the light is irradiated onto the second mask layer 235. The second mask layer 235 of a portion 237 irradiated by the light is changed in physical properties. The backside exposure process is performed using an exposure unit having an I-line wavelength (approximately 248 nm) or an ArF wavelength (approximately 365 nm) instead of a typical e-beam or laser.

Figure 7:
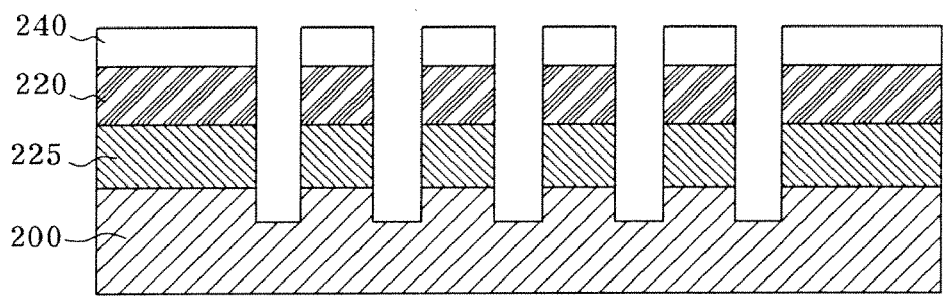

Referring to FIG. 7, a second mask pattern 240 is formed by developing the second mask layer 235 on which the backside exposure process is performed. Particularly, when the second mask layer 235 is developed using a developing solution, the second mask pattern 240 remains on the light blocking pattern 220 due to the physical properties of the positive type photoresist material in which the portion 237 irradiated by the light is removed, and the second mask layer 235 of the portion 237 irradiated by the light through the substrate 200 is removed. Therefore, there is formed the second mask pattern 240 through which gaps between lines of the light blocking pattern 220 are exposed.

Figure 8:
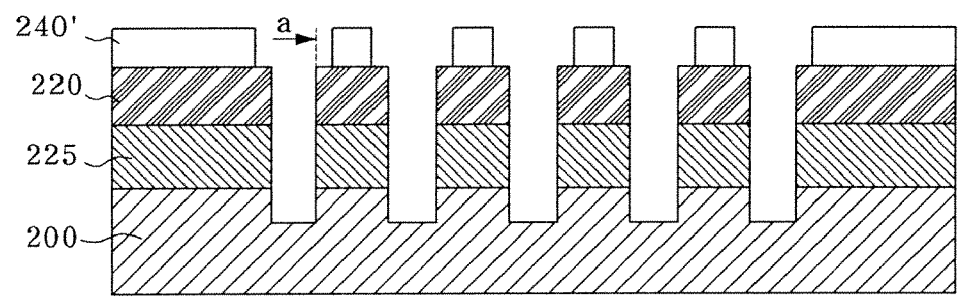
Figure 11A:
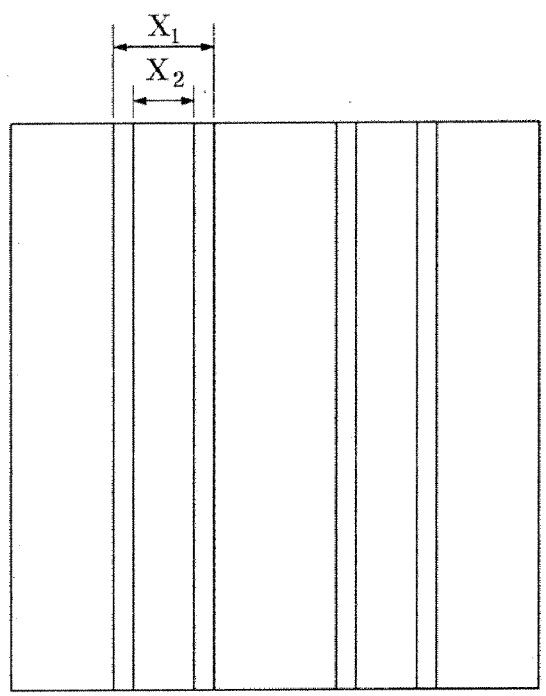
FIGS. 11A to 11C illustrates a reduction tendency in width of a photoresist layer according to ultraviolet (UV) irradiation time.
Figure 11B:
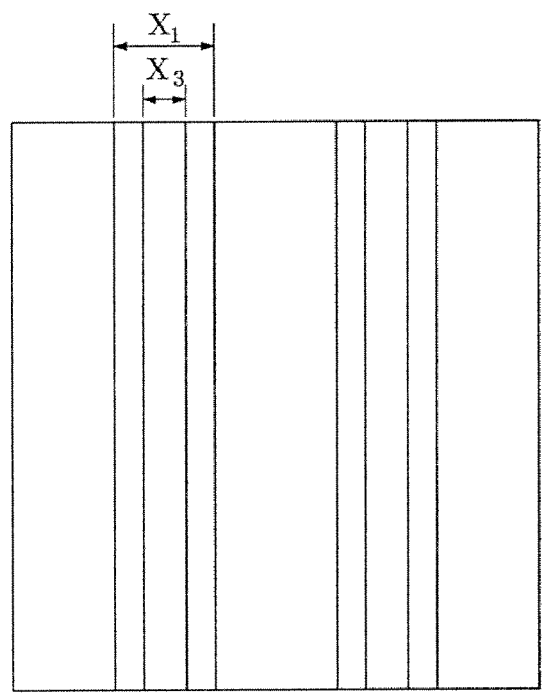
Figure 11C:
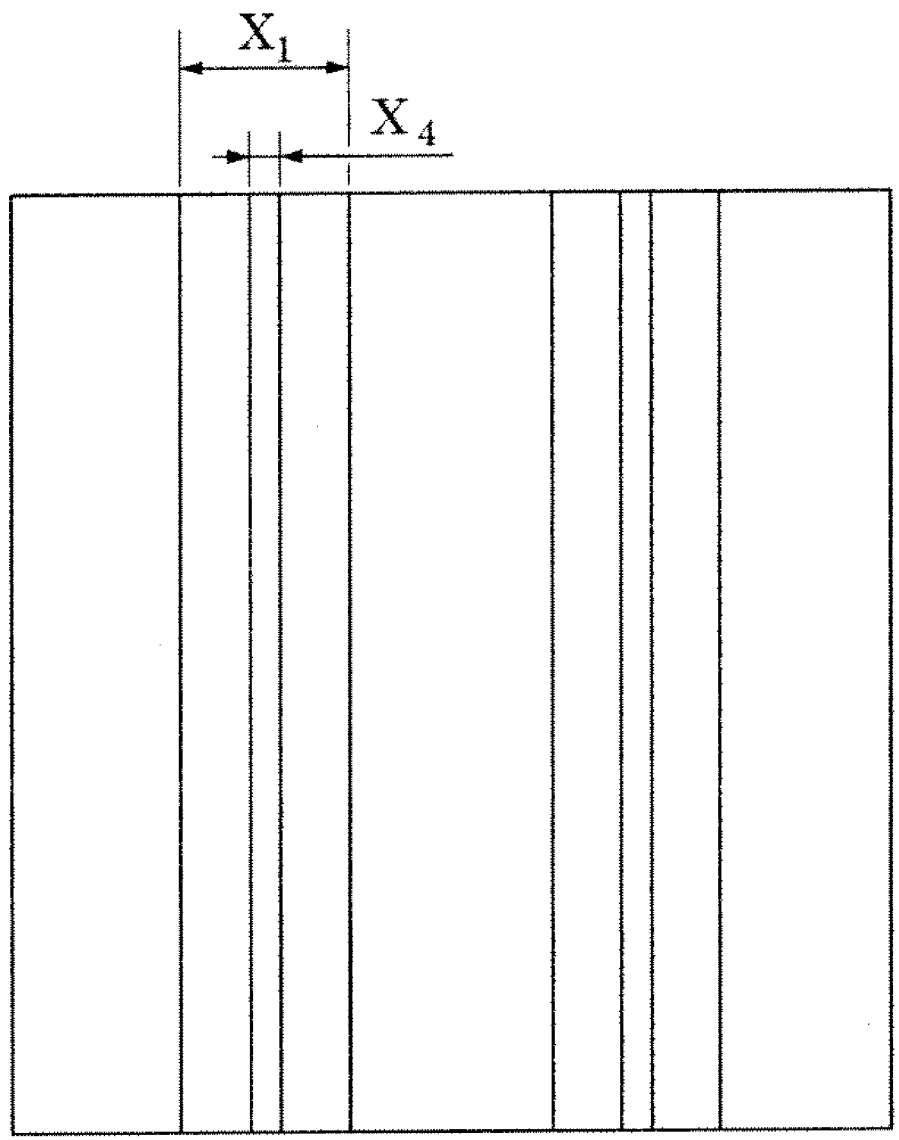

Referring to FIG. 8, a second mask pattern 240' in which a critical dimensions (CD) is reduced by a predetermined width "a" is formed by irradiating ultraviolet (UV) rays having a wavelength of approximately 172 nm onto the substrate 200 including the second mask pattern 240. FIG. 11 illustrates a reduction degree in width of a photoresist layer according to UV irradiation time. Referring to FIGS. 11A to 11C, as the UV irradiation time (FIG. 11C>FIG. 11B>FIG. 11A) increases, a width of a photoresist layer is reduced. It can be easily checked by directly comparing FIG. 11A with FIG. 11C. FIG. 11A illustrates a reduction degree in width of a resist layer X1 before being exposed to the UV rays and a resist layer X2 after being exposed to the UV rays when the second mask pattern 240 is exposed for a relatively short time.

FIG. 11C illustrates a reduction degree in width of the resist layer X1 before being exposed to the UV rays and a resist layer X4 after being exposed to the UV rays when the second mask pattern 240 is exposed for a relatively long time. Although not explained, FIG. 11B illustrates a reduction degree in width of the resist layer X1 before being exposed to the UV rays and a resist layer X3 after being exposed to the UV rays when the second mask pattern 240 is exposed for a certain period of time between the relatively long exposure time and the relatively short exposure time. Hence, the width of the second mask pattern 240' is adjusted by adjusting the UV irradiation time. Therefore, the second mask pattern 240' is aligned on the light blocking pattern 220 without requiring an accurate aligning process. That is, since the width of the mask pattern 240 is reduced to a desired width by adjusting the UV irradiation time, the mask pattern having a desired size can be formed on the light blocking pattern 220 without requiring the accurate aligning process for achieving the high overlay accuracy to adjust the CD of the light blocking pattern 220. Therefore, there is formed a photomask having a pattern size of less than approximately 100 nm.

Figure 9:
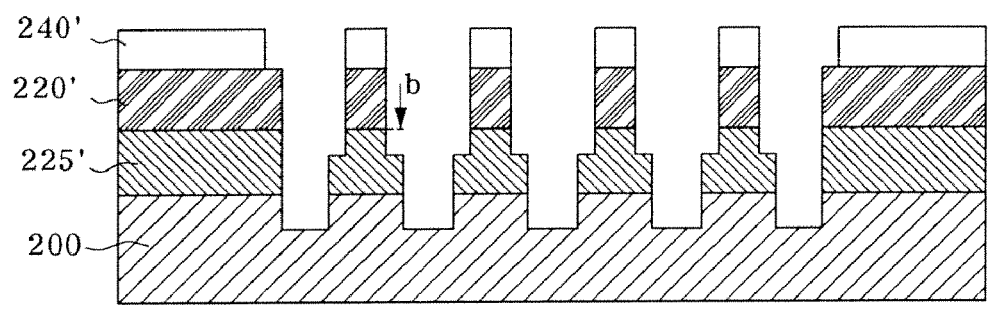

Referring to FIG. 9, the light blocking pattern 220' in which a CD thereof is adjusted is formed by etching the exposed light blocking pattern 220 using the second mask pattern 240' having the reduced width. The phase shift pattern 225' having light transmittance ranging from approximately 5% to approximately 20% is formed by etching the phase shift pattern 225' by a predetermined depth "b" from an exposed surface thereof using the second mask pattern 240' and the light blocking pattern 220' as an etch mask. A portion of the phase shift pattern 225' which is blocked by the light blocking pattern 220' remains such that the phase shift pattern 225' has a height difference by the etched depth b.

Figure 10:
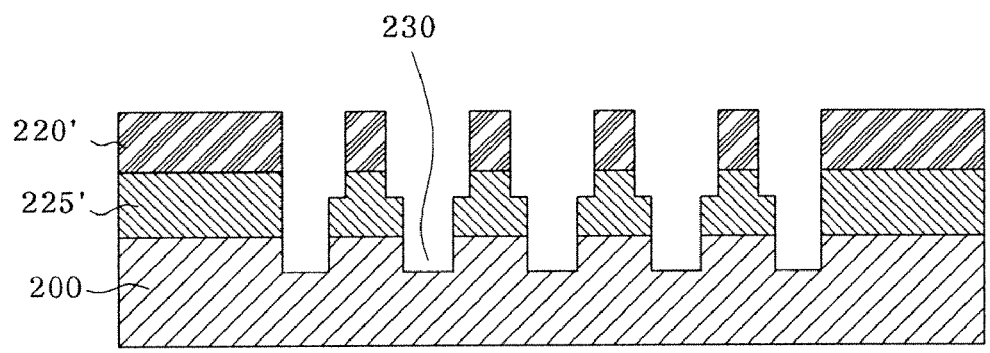

Referring to FIG. 10, the second mask pattern 240' is removed. Therefore, a photomask including a phase shift region, a light blocking region, and a rim region is formed on the substrate 200. The phase shift region is defined by the groove 230 formed in the substrate 200. The light blocking region is defined by the light blocking pattern 220'. The rim region is defined by the phase shift pattern 225' in which the height difference is achieved by the portion blocked by the light blocking pattern 220'. The rim region becomes a high transmittance region which has the light transmittance higher than that of the region which is relatively high in height when the pattern is transferred onto the substrate.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a rim type photomask, the method comprising:

forming a phase shift layer and a light blocking layer on a substrate;

forming a first mask pattern on the light blocking layer;

forming a light blocking pattern from the light blocking layer using the first mask pattern;

forming a phase shift pattern from the phase shift layer using the first mask pattern and the light blocking pattern;

forming a groove in the substrate by etching an exposed portion of the substrate using the light blocking pattern and the phase shift pattern as an etch mask;

forming a mask layer filling the groove formed in the substrate;

forming a second mask pattern on the light blocking pattern, the groove being exposed by patterning the mask layer;

shrinking the second mask pattern to expose a portion of the light blocking pattern by irradiating ultraviolet (UV) rays onto the second mask pattern, wherein a critical dimension (CD) size of the shrunken mask pattern is smaller than the CD size of the light blocking pattern;

etching the exposed portion of the light blocking pattern using the shrunken mask pattern having the shrunken CD size as an etch mask;

forming a height difference by etching the phase shift pattern by a predetermined thickness from a top surface of the phase shift pattern that is exposed by the etching of the light blocking pattern and the shrunken mask pattern; and forming a photomask including a rim region defined by the phase shift pattern having the height difference by removing the shrunken mask pattern.

2. The method of claim 1, wherein the substrate comprises a quartz substrate, the phase shift pattern comprises a molybdenum-based compound, and the light blocking pattern comprises a chrome (Cr) layer.

3. The method of claim 1, wherein the mask layer comprises a positive type photoresist layer.

4. The method of claim 1, wherein the forming of the second mask pattern is performed using a backside exposure process in which light is irradiated from a back side toward a front side of the substrate.

5. The method of claim 1, wherein, in the height difference formed in the phase shift pattern, a region which is relatively low in height has transmittance ranging from approximately 5% to approximately 20%.

6. The method of claim 1, wherein, the second mask pattern which is formed on the light blocking pattern has a same CD size as the light blocking pattern and the phase shift pattern before the irradiating UV rays process.

* * * * *